United States Patent [19]

Jones

[11] Patent Number: 5,781,078

[45] Date of Patent: Jul. 14, 1998

[54] FILTER ENHANCEMENT USING INPUT-TO-OUTPUT GROUND ISOLATION AND SHIELDING

[75] Inventor: Theron L. Jones, Quincy, Ill.

[73] Assignee: Glenayre Electronics, Inc., Charlotte, N.C.

[21] Appl. No.: 759,624

[22] Filed: Dec. 5, 1996

[51] Int. Cl.$^6$ .................................................. H03H 7/01
[52] U.S. Cl. ............................ 333/12; 333/25; 333/167
[58] Field of Search .......................... 333/12, 25, 167, 333/177; 174/32–34; 307/89–91

[56] References Cited

U.S. PATENT DOCUMENTS

| | | | |
|---|---|---|---|
| 2,280,950 | 4/1942 | Harder | 333/12 X |
| 3,084,321 | 4/1963 | Hinrichs et al. | |
| 3,204,201 | 8/1965 | Bahrs | |
| 3,705,365 | 12/1972 | Szabo et al. | 333/12 |
| 4,320,307 | 3/1982 | Schierjott | |
| 4,755,775 | 7/1988 | Marczewski et al. | |
| 5,068,596 | 11/1991 | Banura | |
| 5,091,707 | 2/1992 | Wollmerschauser et al. | 333/12 |
| 5,210,523 | 5/1993 | Tipping | 333/12 X |
| 5,287,008 | 2/1994 | Pahr | |
| 5,297,007 | 3/1994 | Deyo et al. | |
| 5,335,147 | 8/1994 | Weber | |
| 5,353,201 | 10/1994 | Maeda | |
| 5,365,407 | 11/1994 | Nakabayaski et al. | |
| 5,398,169 | 3/1995 | Gorenz, Jr. et al. | |

*Primary Examiner*—Paul Gensler
*Attorney, Agent, or Firm*—Christensen O'Connor Johnson & Kindness PLLC

[57] ABSTRACT

A method and apparatus for filter enhancement in an electrical system (8) is provided. The electrical system (8) includes an input circuit (10) having a filter (14) and an output circuit (20) having a filter (24). An input conductive enclosure (12) and an output conductive enclosure (22) protect the electrical system (8) from field coupling between the input circuit (10) and the output circuit (20). A choke balun (26) is connected between the input circuit (10) and the output circuit (20) to also eliminate conductive coupling. The elimination of unwanted coupling enhances the performance of the electrical system (8) by achieving greater stopband attenuation.

21 Claims, 1 Drawing Sheet

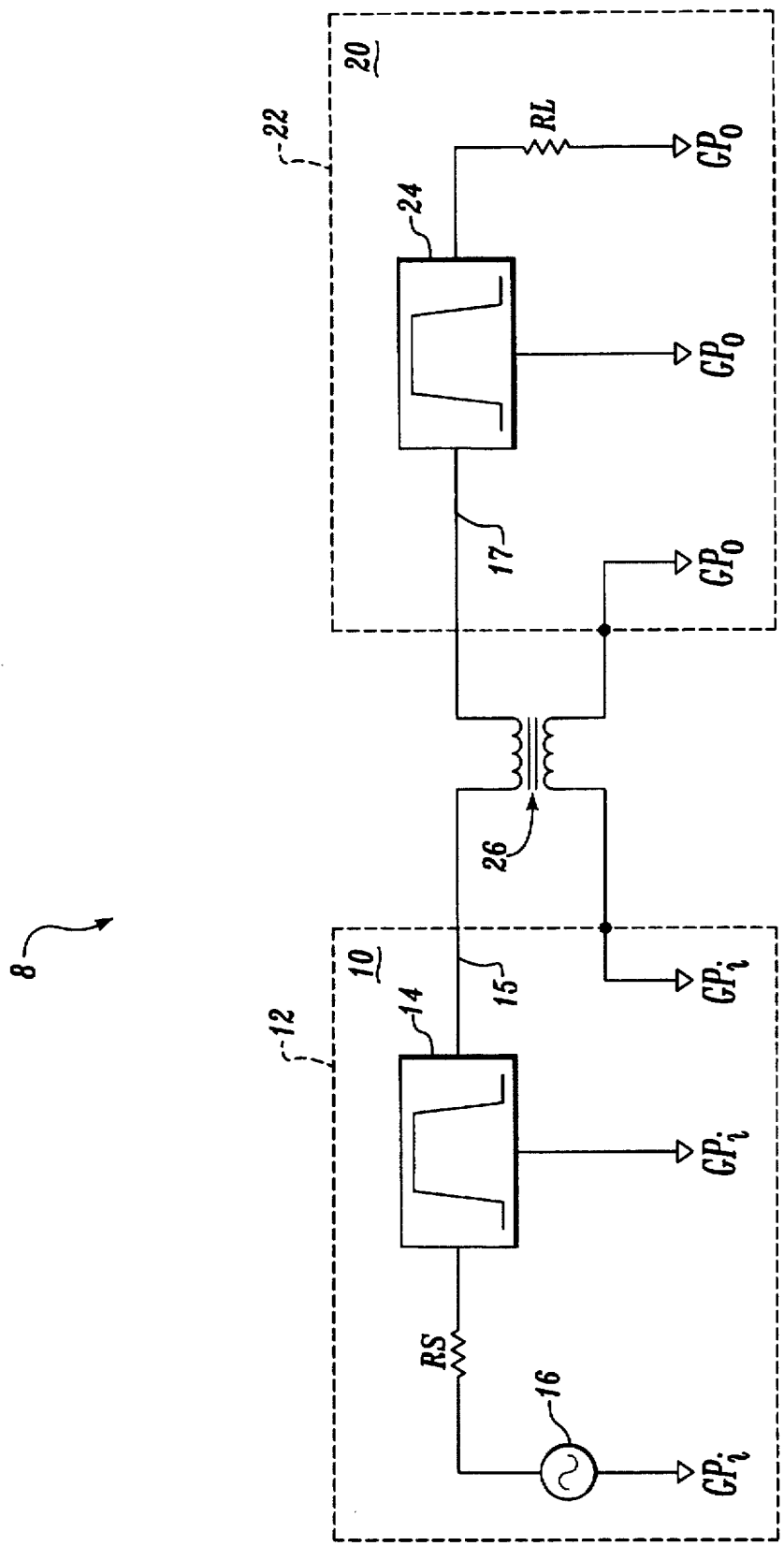

FILTER ENHANCEMENT USING INPUT-TO-OUTPUT GROUND ISOLATION AND SHIELDING

FIELD OF THE INVENTION

This invention relates generally to methods and apparatus for processing signals and, more particularly, to methods and apparatus for filter enhancement.

BACKGROUND OF THE INVENTION

Electrical systems are commonly subjected to signals of varying frequencies. In many instances, only the signals of a predetermined frequency range are of interest in an electrical system application. In this regard, the desired signals of a particular frequency range are typically separated from other unwanted signals and subsequently processed according to the design of the application. Ideally, the unwanted signals, i.e., interference, are eliminated. The preservation of desired signals and elimination of unwanted signals is often crucial to the proper operation and performance of electrical systems.

To separate wanted signals from unwanted signals in this manner, filters are commonly incorporated in electrical systems. Filters select a frequency range of signals for passage or blockage according to the design of an electrical system. The most common filters include, for example, low-pass filters, high-pass filters, band-pass filters, and band-rejection filters, each of which operates as its name implies. Low-pass filters "pass," i.e., preserve, low frequencies and reject high frequencies. High-pass filters pass high frequencies and block low frequencies. Band-pass filters pass a particular band, i.e., range, of frequencies and reject all other frequencies. Band-rejection filters reject a particular band of frequencies and pass all other frequencies.

In an electrical system, filters ideally reject unwanted signals by attenuating the unwanted signals to an appropriate, predetermined level. In practice, however, unwanted signals in a selected frequency range, i.e., stopband signals, are sometimes not sufficiently attenuated in the desired manner. This is due to the coupling of electric fields, magnetic fields, electromagnetic fields, and conduction in the electrical system. Such coupling prevents stopband signals from being applied to filters for attenuation or elimination. Rather, the coupling effectively creates alternate paths for stopband signals that avoid the filters. Accordingly, stopband signals are sometimes not eliminated by the filters. The inability to reject these signals may degrade the performance of the electrical system and, in some instances, effectively disable it.

Different techniques have been developed to address the problems associated with stopband signals caused by unwanted coupling paths. With respect to magnetic field coupling in particular, interference can arise when two or more inductive components are located adjacent one another in an electrical system and oriented to have a certain direction relative to one another. In this regard, the magnetic field lines of the inductors can become coupled together, undesirably causing magnetic field coupling, i.e., mutual inductance. Mutual inductance can significantly limit the performance of an electrical system.

One conventional technique has been proposed to address the unwanted presence of mutual inductance by preventing the interaction of magnetic fields. Under this technique, components in an electrical system are positioned relatively far away from one another. In addition, the components are sometimes oriented in a particular direction, e.g., orthogonally. It will be appreciated that this technique seeks to reduce the coupling of magnetic field lines between circuit components.

While this technique may somewhat reduce magnetic coupling to some arguable degree, it has significant limitations. These limitations are especially pronounced in regard to electrical systems in the form of printed circuit boards. It will be appreciated that printed circuit boards are relatively small in size. As a result, separating circuit components on a printed circuit board to avoid mutual inductance is constrained by the dimensions of the printed circuit board. In many instances, the greatest available separation of circuit components is insufficient to adequately reduce or eliminate the occurrence of magnetic field coupling.

Furthermore, even if circuit components on a printed circuit board can be separated to reduce mutual inductance to some degree, this measure poses its own disadvantages. Typically, circuit components are separated on a printed circuit board by wire connections commonly referred to as traces. Preferably, the trace has a limited length so that at relatively high operating frequencies, the voltage on opposite ends of the trace will ideally have an approximately equal value. If, however, the operating frequency is relatively large, the voltage on opposite ends of the trace may undesirably have different values due to rapid phase changes associated with high frequency signals. In that case, the extent of the voltage difference along the trace will be proportional to the length of the trace. This phenomenon is commonly known as a transmission line effect, and can lead to undesirable effects for lumped element filters. Therefore, because traces must be limited in length to reduce transmission line effects, the separation of circuit components to reduce mutual inductance is significantly limited.

In addition to mutual induction caused by magnetic field coupling, electric field coupling between circuit components is another source of interference that plagues electrical systems. Circuit components in an electrical system may interact to undesirably generate electric field coupling, also referred to as mutual capacitance. It will be appreciated that electric fielding coupling occurs when emanating electric field lines of one circuit component terminate on another component. For example, traces in printed circuit boards, when positioned in close proximity, can produce electric field coupling between one another. Electric field coupling causes unwanted paths for stopband signals circumventing filters intended to eliminate them.

Techniques to address electric field coupling have been proposed. One approach involves the provision of a ground plane between circuit components and traces. Under this approach, the electric field lines emanating from one circuit component that would otherwise terminate on another circuit component would ideally instead terminate on the ground plane. In practice, terminating electric field lines on a ground plane to avoid electric field coupling, although marginally useful, has significant disadvantages.

The primary problem of this conventional approach relates to the use of ground planes proposed under this approach. It will be appreciated that theoretically only perfectly conductive ground enclosures can entirely overcome electric field coupling. In reality, ground planes are never perfect conductors that exhibit the same potential throughout the entire ground plane. This is because ground planes always have a finite impedance through which currents must flow. This yields differences in potential throughout the plane. A ground plane having different potentials cannot eliminate electric field coupling. In this regard, efforts under this conventional approach have been relegated to merely minimizing the potentially degrading effects of electric field coupling.

Apart from electric field and magnetic field coupling, interference caused by conduction is yet another problem in electrical systems that has prompted proposals to address it. Interference resulting from conduction commonly originates from electrical currents circulating on electrical circuit grounds. In this regard, printed circuit boards often include plane regions acting as a ground potential. Ground connections in the electrical system are made to the ground planes. It will be appreciated that such ground planes are not perfect grounds. Rather, they typically have a finite impedance, as stated above. Unbalanced currents circulating on the ground plane flow through the finite impedance and thereby induce voltages thereon. The voltages in turn create unwanted signal coupling paths along the ground plane in the electrical system around the filters in the electrical system. In this way, the interference appears in the electrical system as a noise voltage source in series with the output of a filter. As a result, the integrity of the electrical system and its filtering capability is limited by conduction on the ground planes.

To address this problem, various attempts have been made to lower the impedance of ground planes. It was hoped that by lowering impedance, the presence of interference caused by ground coupling would be significantly reduced. One conventional technique calls for a single, continuous metal solid plane formed on one side of a printed circuit board away from electrical components. Electrical components and wire connections are made on the other side of the printed circuit board. Although this configuration somewhat lowers the impedance between any two points on the ground plane, it does not adequately reduce the impedance of a ground plane to eliminate conductive interference.

To further minimize the impedance of a ground plane, conventional techniques teach the connection of additional ground planes in parallel in an electrical system. The ground planes are connected using vias, i.e., small pieces of metal inserted into a printed circuit board and electro-plated to make an electrical connection. The parallel connections serve to further lower the impedance of the ground potential. The ground planes together effectively act as a group of impedances connected in parallel.

The design of electrical systems having multiple ground planes to minimize impedance has significant limitations. In electrical systems involving high frequencies, including, for example, radio frequency applications, most of the current will flow in the ground plane closest to the component side of the printed circuit board. Less current flows in subsequent ground planes because currents take the path of least impedance. Thus, the overall effective impedance under this conventional approach is affected very little.

A similar conventional approach dictates connecting the ground plane of a printed circuit board to the chassis in which the printed circuit board rests. Like the addition of ground planes, the chassis connection adds a parallel impedance and thus lowers the overall impedance of the electrical system. As is true of the conventional techniques described above to reduce interference, the chassis connection has significant drawbacks. First, like the provision of ground planes connected in parallel, connections to the chassis act as inductors, impeding the current flow through the chassis. Accordingly, the ability to reduce conductive interference is limited. In addition, the chassis typically isolates internal circuits from external electrical noise sources. In doing so, the chassis is subjected to these external noise sources. If the chassis is electrically connected to the internal circuit, as is true in this conventional approach, the external noise sources become coupled to the internal circuit. The chassis essentially becomes a source of more interference. As a result, the performance of the internal circuit is degraded.

Finally, conventional techniques have been directed at overcoming the presence of interference caused by electromagnetic field coupling. Electromagnetic fields originate in electrical systems having devices to transform electric currents into radiating electromagnetic waves. Many of the unsatisfactory techniques to address the more dominant problems associated with electric field coupling and magnetic field coupling have also failed to adequately address electromagnetic field coupling. Some attempts by others have focused on the less dominant, yet still significant, problems caused by electromagnetic field coupling specifically. These attempts are too numerous and diverse to discuss in detail. Essentially, the more noteworthy attempts focused on modifying the design of an electrical system to function less like an antenna. Antenna design principles were accordingly implemented to satisfy this design goal. These efforts have failed to satisfactorily overcome the presence of unwanted electromagnetic field coupling and its attendant degradation of the filtering performance of electrical systems.

It is apparent that the above-mentioned and other conventional approaches to address unwanted coupling in electrical systems are unsatisfactory. Each of the approaches fails to overcome the problems associated with both field coupling and conductive coupling effects that degrade the effectiveness of filters. The present invention is directed to providing filtering enhancement to eliminate these coupling effects and, thereby, reduce interference in electrical systems.

SUMMARY OF THE INVENTION

In accordance with this invention, a method and apparatus for filter enhancement in an electrical system is provided. The electrical system includes an input circuit having a filter and an output circuit having a filter. An input conductive enclosure contains the input circuit while an output conductive enclosure contains the output circuit. These conductive enclosures protect the electrical system from unwanted field coupling between the input circuit and the output circuit. A choke balun couples the input circuit to the output circuit to eliminate conductive coupling between the input circuit and the output circuit along ground planes in the electrical system. The elimination of field and conductive coupling removes coupling paths that stopband signals can otherwise take to circumvent the filters. As a result, the present invention provides more effective filtering.

As will be readily appreciated by the foregoing summary, the present invention achieves optimal filtering in an electrical system by eliminating coupling paths around filters. Techniques used previously to address unwanted coupling effects have been numerous. As discussed above, many different techniques have been proposed to address the different coupling types including electric field coupling, magnetic field coupling, electromagnetic field coupling,-and conductive coupling. These prior art efforts, that typically addressed only one distinct type of coupling, have been unsuccessful. Moreover, no singular technique has been offered to address all types of coupling collectively. In contrast, the present invention provides a simple, singular technique to overcome all types of coupling, rather than the unsuccessful, piecemeal efforts proposed by the prior art.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 is a simplified schematic diagram of an electrical system for filter enhancement formed in accordance with the invention.

DETAILED DESCRIPTION OF THE PREFERRED EMBODIMENT

FIG. 1 is a simplified schematic diagram of a method and apparatus for filter enhancement using input to output ground isolation and shielding in accordance with the present invention. The present invention is incorporated in an electrical system 8 to effectively reduce or eliminate unwanted coupling paths therein. The elimination of unwanted coupling paths in turn reduces or effectively eliminates the presence of interference in the electrical system 8 that can otherwise function to degrade its performance.

The electrical system 8 includes an input circuit 10 and an output circuit 20 connected by a choke balun 26. The input circuit 10 and the output circuit 20 are preferably implemented on a dedicated printed circuit board (not shown) that is electrically connected to a chassis (not shown). The input circuit 10 includes a signal source 16, a source resistor designated RS, and a filter 14. These components of the input circuit 10 are preferably formed on a top side of the printed circuit board. As discussed in more detail below, the electrical path from the signal source 16, through the resistor RS, and through the filter 14 serve as part of a signal line 15 in the input circuit. The signal source 16 produces a source signal selected to have a predetermined operating frequency, in one application approximately 900 MHz. The signal source 16 is connected to an input ground potential of the input circuit 10. The input ground potential is provided by a connection to an input ground plane designated $GP_i$ on a bottom side of the printed circuit board. The input ground plane $GP_i$ is metallic, having an area that extends to substantially coincide with the perimeter of the input circuit 10. All of the ground connections in the input circuit 10 are made to the input ground plane $GP_i$.

The signal source 16 is connected in series to the input of the filter 14 through the resistor RS. The resistor RS may have a value of approximately 50 ohms, as is commonly true of resistors found in electrical systems suitable for use in, for example, communications applications. As will be appreciated by those skilled in this art and others, other values for the resistor RS could be chosen.

The source signal 16 is applied through resistor RS to the filter 14. The filter 14 is depicted in FIG. 1 as a band-pass filter. However, the method and apparatus for filter enhancement formed in accordance with the present invention may also employ another kind of filter including, for example, a low-pass filter, a high-pass filter, or a band-rejection filter. In any event, the filter 14 preserves signals in the electrical system within a desired frequency range commonly referred to as the passband. Accordingly, passband signals emerge from the output of the filter 14. The unwanted signals in the frequency range outside the passband, commonly referred to as the stopband, are ideally attenuated by the filter 14 to a predetermined level. The stopband signals are eliminated to maintain the proper operation and performance of the electrical system 8. It will be appreciated that the input circuit 10 illustrated in FIG. 1 comprising the signal source 16, the resistor RS, and the filter 14 is a simplified diagram. Of course, other circuit components could be added to the input circuit 10 in accordance with the present invention, depending on the particular application of the present invention. In any event, the present invention calls for the input circuit 10 to have a filter and a ground plane.

The output of the input circuit 10, i.e., the output of the filter 14 along the signal line 15, is applied to the output circuit 20 through the choke balun 26, as described in more detail below. The output circuit 20 includes a filter 24, and a load resistor designated RL. The filter 24 and the resistor RL are formed on a top side of the printed circuit board. The path from the filter 24 through the resistor RL serves as part of a signal line 17 in the output circuit 20. The signal received by the output circuit 20 is applied to the filter 24. The filter 24 is depicted in FIG. 1 as a band-pass filter. However, like the filter 14 in the input circuit 10, the filter 24 could alternatively be a low-pass filter, a high-pass filter, or a band rejection filter. In any case, the filter 24 passes desired signals in the passband and attenuates unwanted signals in the stopband to a predetermined level.

The signals in the passband emerge from the filter 24 and are connected to an output ground potential through the resistor RL. The output ground potential is provided by a connection to an output ground plane designated $GP_o$. Preferably, the resistor RL has a value of approximately 50 ohms. Of course, often values for resistor RL could also be used. The output ground plane $GP_o$ is electrically isolated from the input ground plane, as described in more detail below. The output ground plane is located adjacent a bottom side of the printed circuit board. All ground potential connections in the output circuit 20, including a ground connection of the filter 24, are connected to the output ground plane $GP_o$. The output circuit 20 processes the filtered signal from the filter 24 according to the particular application of the electrical system 8.

As stated above, the filter 14 of the input circuit 10 and the filter 24 of the output circuit 20 function to effectively eliminate stopband signals in the electrical system 8 to an acceptable, predetermined level. More specifically, the purpose of the filter 14 is to attenuate stopband signals in the input circuit 10 to a predetermined level. Similarly, the purpose of the filter 24 is to receive the attenuated stopband signals of the input circuit and further attenuate them in the output circuit 20 to a specified level. Together the filters 14, 24 ideally attenuate stopband signals to a level represented by the sum of the attenuation level provided by each filter. The filters 14, 24 are intended to meet the filtering requirements of the electrical system 8.

As long as all signals of the electrical system 8 are applied first to the filter 14 and then to the filter 24, the stopband signals are appropriately removed in accordance with the design of the electrical system 8. However, it will be appreciated, that the desired attenuation provided by filters in electrical systems is often not actually achieved. In these instances, stopband signals circumvent the filters that are intended to eliminate them. As a result, the stopband signals survive as interference in an electrical system at unattenuated levels to degrade the performance of the electrical system.

Stopband signals remain unfiltered in electrical systems because they take coupling paths around filters. The coupling paths are created by undesirable electromagnetic field interaction between circuit components therein. In particular, the presence of interference can be caused by electrical field coupling (commonly referred to as mutual capacitive coupling), magnetic field coupling (commonly referred to as mutual inductive coupling), and electromagnetic field coupling.

To overcome the problems associated with interference caused by electric field coupling, magnetic field coupling, and electromagnetic field coupling, the method and apparatus for filter enhancement formed in accordance with the present invention further includes an input conductive enclosure 12 and an output conductive enclosure 22. The input conductive enclosure 12 includes an input shield can and the input ground plane $GP_i$, that together form the boundaries of the input conductive enclosure 12. The input shield can is preferably configured as a box with an open-ended side. The input shield can is sufficiently large so that its open side can contain the input circuit 10, as discussed below. The exact dimensions of the input shield can will vary according to the size of the input circuit 10.

The input shield can is engaged with the input circuit 10 so that its open side coincides with the input ground plane $GP_i$. In this way, the shield can forms the top and walls of the input conductive enclosure 12 while the input ground plane $GP_i$ serves as the bottom enclosure of the input conductive enclosure 12. The input shield can is soldered to the circuit board containing the input circuit 10 so that the shield can and the input ground plane $GP_i$ are connected both physically and electrically.

The output conductive enclosure 22 contains the output circuit 20. The output conductive enclosure 22 comprises an output shield can and the output ground plane $GP_O$. The output shield can is preferably in the form of an open-ended box sufficient in size to cover the output circuit 20. It will be appreciated that the output shield can, like the input shield can, may take other forms defining an enclosure. The output ground plane $GP_O$ and the output shield can are engaged to form an enclosure around the circuit components of the output circuit 20. In this regard, the output shield can is inverted and placed on the output ground plane $GP_O$ and over the output circuit 20 and soldered thereto. The input shield can and the output shield can each preferably have a removable top to allow access to the components of their corresponding circuits 10, 20.

The input shield can and the output shield can are available from Leader Tech., Inc., Tampa, Fla. In the preferred embodiment, the input conductive enclosure 12 and the output conductive enclosure 22 are tied together to a common potential. The input conductive enclosure 12 and the output conductive enclosure 22 are capacitively tied to the chassis 30. This connection to the chassis 30 provides a common potential for the input conductive enclosure 12 and the output conductive enclosure 22. Alternatively, the input shield can and output shield can may be formed in accordance with U.S. Pat. No. 5,195,644 to Schmid entitled "Sealed, Seamless Box and Method of Manufacturing Same" and assigned to the same assignee as the present invention.

The input conductive enclosure 12 and the output conductive enclosure 22 reduce field interaction between the input circuit 10 and the output circuit 20. This reduction in turn reduces alternate paths that stopband signals can take around the input filter 14 and the output filter 24. More specifically, the input conductive enclosure 12 and the output conductive enclosure 22 contain stopband signals originating in the input circuit 10 and the output circuit 20 respectively. The containment of these signals within one circuit prevents them from otherwise interfering with the other circuit. At the same time, the input conductive enclosure 12 and the output conductive enclosure 22 protect the input circuit 10 and the output circuit 20 respectively from externally generated signals that could potentially create interference in the circuits. Thus, the filtering problems associated with electric field coupling, magnetic field coupling, and electromagnetic field coupling are overcome by the input conductive enclosure 12 and the output conductive enclosure 22 of the present invention.

Furthermore, as noted above, the input conductive enclosure 12 and the output conductive enclosure 22 are electrically connected to a common potential through the chassis 30. This connection prevents further electric field coupling that might otherwise occur between the outer surfaces of the input conductive enclosure 12 and the output conductive enclosure 22. As a result, currents caused by such coupling that can create interference are avoided.

Apart from the unwanted effects of electric field coupling, magnetic field coupling, and electromagnetic field coupling, conductive coupling can be present to plague the optimal performance of electrical systems. To effectively reduce or eliminate the occurrence of conductive coupling, the method and apparatus of filter enhancement formed in accordance with the present invention includes the choke balun 26. As noted above, the choke balun 26 couples the input circuit 10 to the output circuit 20. The choke balun 26 is not contained by the input conductive enclosure 12 or the output conductive enclosure 22. The choke balun 26 includes a coaxial cable wrapped around a ferrite material. Preferably, the ferrite material is in the form of a ferrite toroid. Of course, however, the ferrite material may take other geometries including, for example, a ferrite rod, or other shape.

The ferrite toroid was chosen to have a relative permeability having a value in the range of approximately 75–100. This range was selected to optimize the frequency response of the choke balun 26 at 900 MHz, as discussed in more detail below. The ferrite toroid is available from Fair-Rite Products, Wallkill, N.Y. The coaxial cable is wrapped approximately 5.5 times around the ferrite toroid. Preferably, the windings are spaced approximately 5/16 inches apart from one another. Of course, other dimensions for windings spacing are possible, depending on the particular application. Because the ferrite toroid is relatively small, the coaxial cable is dimensioned to have an acceptable minimum bend radius. The minimum bend radius provides flexibility to the coaxial cable so that the outer conductor of the coaxial cable or any other part thereof does not crack or otherwise break. The coaxial cable is available from Haverhill Cable and Manufacturing Corp., Haverhill, Mass. The number of windings of the coaxial cable, the use of ferrite as the magnetic core, and the spacing between windings were chosen to maximize the frequency response of the choke balun 26. In essence, the choke balun 26 is designed to maximize its impedance to unwanted common mode signals following conductive coupling paths at the operating frequency of approximately 900 MHz.

A first end of the outer conductor of the coaxial cable is connected to the input ground plane $GP_i$. A second end of the outer conductor of the coaxial cable is connected to the output ground plane $GP_O$. The inner conductor of the coaxial cable also connects the input circuit 10 to the output circuit 20 inside the respective conductive enclosures. More specifically, a first end of the inner conductor is connected to the signal line 15 carrying the output of the input filter 14. A second end of the inner conductor is connected to the signal line 17 carrying the input of the output filter 24.

The choke balun 26 isolates the input ground plane $GP_i$ from the output ground plane $GP_O$. In doing so, the choke balun 26 eliminates the conductive coupling path between the input circuit 10 and the output circuit 20. In this regard, the choke balun 26 acts as a common mode choke to reject only unbalanced common mode signals, i.e., the unwanted currents following conductive coupling paths along the ground planes. Such common mode signals induce a magnetic flux in the ferrite toroid. The magnetic flux in turn generates an EMF which opposes the flow of the unbalanced currents. Accordingly, the choke balun 26 impedes the flow of unbalanced stopband signals from the input circuit 12 to the output circuit 22 around the filters 14, 24. At the same time, pass band signals, i.e., differential signals induce no magnetic flux in the choke balun 26. Accordingly, they are transmitted from the filter 14 in the input circuit 10 to the filter 24 in the output circuit 20. Because the inner conductor of the coaxial cable is shielded by the outer conductor, the shielding of the signal path from the input circuit 12 to the output circuit 22 is maintained. As a result, the choke balun 26 effectively eliminates the unwanted effects caused by the conductive coupling of stopband signals from the input circuit 10 and the output circuit 20.

While the preferred embodiment of the invention has been illustrated and described, it will be appreciated that various changes can be made therein without departing from the spirit and scope of the invention. As discussed above, the number of windings of the coaxial cable around the ferrite toroid and the relative permeability of the ferrite toroid are matched to accommodate operating frequencies of approximately 900 MHz. However, other operating frequencies involving the signal source 16 can be selected in accordance with the present invention. For example, if a lower operating frequency is chosen, the number of windings of the coaxial cable should attendantly increase. In addition, a core, perhaps other than ferrite, should be selected having a higher relative permeability.

In contrast, an operating frequency higher than 900 MHz could also be used in an application of the present invention. In that instance, the number of windings of the coaxial cable should correspondingly decrease. Also, a core with a lower relative permeability should be used. These measures optimize the attenuation of common mode attenuation of unbalanced currents otherwise conductively coupled between the input circuit 12 and the output circuit 22.

It will also be appreciated by those skilled in this art and others that the recited filters 14, 24 need not necessarily be two separate filters. Instead, the filter 14 could be one stage of a single filter while the output filter 24 serves as a second stage of the same filter. Similarly, the present invention anticipates the provision of multiple filters or filter stages in either or both the input circuit 12 and the output circuit 22. Consequently, within the scope of the appended claims, it will be appreciated that the present invention can be practiced otherwise than as specifically described herein.

The embodiments of the invention in which an exclusive property or privilege is claimed are defined as follows:

1. An electrical system for filter enhancement comprising:
   (a) an input circuit including:
      (i) a signal source for generating a source signal having a predetermined frequency; and
      (ii) a filter coupled to said signal source for receiving signals related to said source signal and producing a first filtered signal;
   (b) an output circuit having a filter, said output circuit for receiving signals related to said first filtered signal and producing a second filtered signal;
   (c) a choke balun coupling said input circuit to said output circuit to prevent the conductive coupling of stopband signals from said input circuit and said output circuit;
   (d) an input conductive enclosure enclosing said input circuit to prevent field coupling between said input circuit and said output circuit; and
   (e) An output conductive enclosure enclosing said output circuit to prevent field coupling between said output circuit and said input circuit.

2. An electrical system as claimed in claim 1 wherein all ground connections of said input circuit are connected to an input ground plane and all ground connections of said output circuit are connected to an output ground plane, said output ground plane electrically coupled by said choke balun to said input ground plane.

3. An electrical system as claimed in claim 2 wherein said input conductive enclosure is connected to said input ground plane and said output conductive enclosure is connected to said output ground plane.

4. An electrical system as claimed in claim 2 wherein said choke balun includes:
   a ferrite material; and
   a coaxial cable wrapped a predetermined number of times around said ferrite material to form windings, said coaxial line having a signal inner conductor for coupling signals between said input circuit and said output circuit, and a ground outer conductor connecting said input ground plane with said output ground plane.

5. An electrical system as claimed in claim 4 wherein said ferrite material is a ferrite toroid.

6. An electrical system as claimed in claim 5 wherein said predetermined frequency is approximately 900 MHz.

7. An electrical system as claimed in claim 6 wherein said ferrite toroid has a relative permeability of approximately 75–100.

8. An electrical system as claimed in claim 7 wherein said predetermined number of turns is approximately 5.5.

9. An electrical system as claimed in claim 8 wherein said windings are spaced approximately 5/16 inch apart from one another.

10. An electrical system as claimed in claim 5 wherein said predetermined number of turns is approximately 5.5.

11. An electrical system as claimed in claim 5 wherein said ferrite toroid has a relative permeability of approximately 75–100.

12. An electrical system as claimed in claim 5 wherein said windings are spaced approximately 5/16 inch apart from one another.

13. An electrical system as claimed in claim 5 wherein said ferrite toroid has a relative permeability of approximately 75–100.

14. A method of enhancing filter performance in an electrical system having an input circuit, an output circuit, and a predetermined operating frequency, the input circuit and the output circuit each having a filter, a signal line, and a ground plane, the method comprising:
   enclosing the input circuit with an input conductive enclosure;
   enclosing the output circuit with an output conductive enclosure; and
   coupling a choke balun between the input circuit and the output circuit.

15. A method as claimed in claim 14 wherein said coupling comprises:
   (a) providing a ferrite material having a predetermined relative permeability;
   (b) wrapping a coaxial line a predetermined number of turns around said ferrite material to form windings, said coaxial line having an inner conductor and an outer conductor;

(c) connecting said inner conductor between said signal lines of said input circuit and said output circuit;

(d) connecting said inner conductor between said ground plane of said input circuit and said ground plane of said output circuit; and (e) spacing said windings to have a predetermined distance from one another.

16. The method as claimed in claim 15 wherein said ferrite material is a ferrite toroid.

17. A method as claimed in claim 16 wherein said operating frequency is approximately 900 MHz, said predetermined number of turns is approximately 5.5, said predetermined relative permeability is approximately 75–100, and said predetermined distance is approximately 5/16 inch.

18. A method as claimed in claim 16 further comprising decreasing said predetermined permeability of said ferrite toroid when said operating frequency is greater than approximately 900 MHz.

19. A method as claimed in claim 16 further comprising decreasing said predetermined number of turns when said operating frequency is greater than approximately 900 MHz.

20. A method as claimed in claim 16 further comprising increasing said predetermined permeability of said ferrite toroid when said operating frequency is less than approximately 900 MHz.

21. A method as claimed in claim 16 further comprising increasing said predetermined number of turns when said operating frequency is less than approximately 900 MHz.

* * * * *